(12) United States Patent
Tang et al.

(10) Patent No.: US 9,436,241 B2
(45) Date of Patent: Sep. 6, 2016

(54) ELECTRONIC DEVICE AND METHOD FOR ADJUSTING FAN OF ELECTRONIC DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Xian-Xiu Tang, Shenzhen (CN); Xian-Guang Tan, Shenzhen (CN); Ning Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 458 days.

(21) Appl. No.: 13/972,894

(22) Filed: Aug. 21, 2013

(65) Prior Publication Data

US 2015/0002999 A1 Jan. 1, 2015

(30) Foreign Application Priority Data

Jun. 26, 2013 (CN) .................. 2013 1 0259995.9

(51) Int. Cl.
*G06F 1/20* (2006.01)
*H05K 7/20* (2006.01)

(52) U.S. Cl.
CPC .............. *G06F 1/206* (2013.01); *G06F 1/20* (2013.01); *G06F 1/203* (2013.01); *H05K 7/20209* (2013.01); *Y02B 60/1275* (2013.01); *Y10S 236/09* (2013.01)

(58) Field of Classification Search
CPC ................ H05K 7/20209; H05K 7/20836; F24F 11/001; F24F 11/0012; F24F 11/006; F24F 11/0079; F24F 2011/0038; G05D 23/19; H02P 6/001; H02P 6/165; G06F 1/20; Y02B 30/746; Y10S 2366/09
See application file for complete search history.

(56) References Cited

U.S. PATENT DOCUMENTS

| | | | | |
|---|---|---|---|---|
| 5,634,346 A * | 6/1997 | Ramakrishnan | ....... | F24F 11/006 62/179 |
| 5,906,315 A * | 5/1999 | Lewis | ................. | F24F 11/0086 236/49.3 |
| 6,777,900 B2 * | 8/2004 | Lee | ........................ | G06F 1/206 318/268 |
| 7,036,027 B2 * | 4/2006 | Kim | ........................ | G06F 1/206 361/679.48 |
| 7,202,624 B2 * | 4/2007 | Hardt | ................. | H05K 7/20836 318/255 |
| 7,331,532 B2 * | 2/2008 | Currie | ................ | H05K 7/20209 236/49.3 |
| 7,583,043 B2 * | 9/2009 | Chung | ............... | G05D 23/1917 318/471 |
| 7,948,196 B2 * | 5/2011 | Begun | ................ | H05K 7/20209 318/268 |
| 8,140,195 B2 * | 3/2012 | Matteson | ................ | G06F 1/206 361/676 |
| 8,606,428 B2 * | 12/2013 | Chan | .................. | H05K 7/20518 361/679.48 |

(Continued)

*Primary Examiner* — Crystal J Barnes-Bullock
(74) *Attorney, Agent, or Firm* — Zhigang Ma

(57) ABSTRACT

In a method for adjusting a fan of an electronic device, a sensor of the electronic device detects an instant work environment temperature of an electronic component of the electronic device. The detected temperature is obtained from the sensor. The speed of the fan under the detected temperature and a speed of the fan to which it may be adjusted is computed using a predefined algorithm based on prestored values, obtained from experimentation. The fan is adjusted to achieve a heat dissipation mode and an energy-saving mode of the electronic device accordingly.

6 Claims, 4 Drawing Sheets

(56) References Cited

U.S. PATENT DOCUMENTS

| | | | | |
|---|---|---|---|---|
| 8,930,004 B2* | 1/2015 | Su | ............................ | G05D 23/19 381/57 |
| 9,213,343 B2* | 12/2015 | Campbell | ............ | G05D 23/1932 |
| 9,218,008 B2* | 12/2015 | Campbell | ............ | G05D 23/1932 |
| 2006/0168975 A1* | 8/2006 | Malone | ................... | F24F 11/001 62/180 |
| 2007/0027580 A1* | 2/2007 | Ligtenberg | ............. | G05D 23/19 700/300 |
| 2008/0272720 A1* | 11/2008 | Kausch | .................... | H02P 6/001 318/400.17 |
| 2012/0329377 A1* | 12/2012 | Wu | .......................... | G06F 1/206 454/184 |

* cited by examiner

ELECTRONIC DEVICE AND METHOD FOR ADJUSTING FAN OF ELECTRONIC DEVICE

BACKGROUND

1. Technical Field

The embodiments of the present disclosure relate to an electronic device and method for adjusting fan of the electronic device.

2. Description of Related Art

An electronic component installed in an electronic device, such as a CPU, usually depends on a fan to dissipate heat. If a work environment temperature of the electronic component is too high, a speed of a fan is increased to make a heat dissipation. Otherwise, if the work environment temperature of electronic component is too low, the speed of the fan is reduced to save energy. However, the fan cannot be adjusted automatically to reduce a work environment temperature of the electronic component, and to save power of the electronic device.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

In general, the word "module," as used herein, refers to logic embodied in hardware or firmware, or to a collection of software instructions, written in a programming language. In one embodiment, the program language may be Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, flash memory, and hard disk drives.

Figure 1:
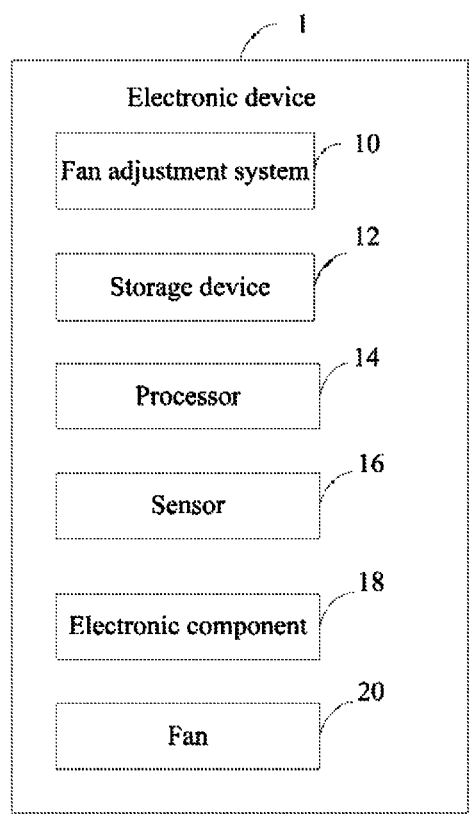
FIG. 1 is a block diagram of one embodiment of an electronic device including a fan adjustment system.

FIG. 1 is a block diagram of one embodiment of an electronic device 1 including a fan adjustment system 10. The electronic device 1 comprises a storage device 12, at least one processor 14, a sensor 16, an electronic component 18, and a fan 20. The electronic device 1 may be a PDA (personal digital assistant) device, a smart phone, a personal computer, or a tablet computer, for example.

In one embodiment, the storage device 12 (a non-transitory storage device) may be an internal storage system, such as a random access memory (RAM) for the temporary storage of information, and/or a read only memory (ROM) for the permanent storage of information. In some embodiments, the storage device 12 may be an external storage system, such as an external hard disk, a storage card, or a data storage medium.

The at least one processor 14 may include a processor unit, a microprocessor, an application-specific integrated circuit, and a field programmable gate array, for example.

The sensor 16 detects an instant work environment temperature of the electronic component 18. The work environment can be identified as a place that electronic component 18 works in.

The electronic component 18 is an electronic component in an electronic system. In the embodiment, the electronic component 18 may be a CPU, a memory, a hard disk, for example. Such electronic component 18 may use the fan 20 to dissipate heat.

In one embodiment, the fan adjustment system 10 includes a plurality of function modules which include computerized codes or instructions that can be stored in the storage device 12 and executed by the at least one processor 14 to provide a method for adjusting fan of the electronic device 1.

Figure 2:
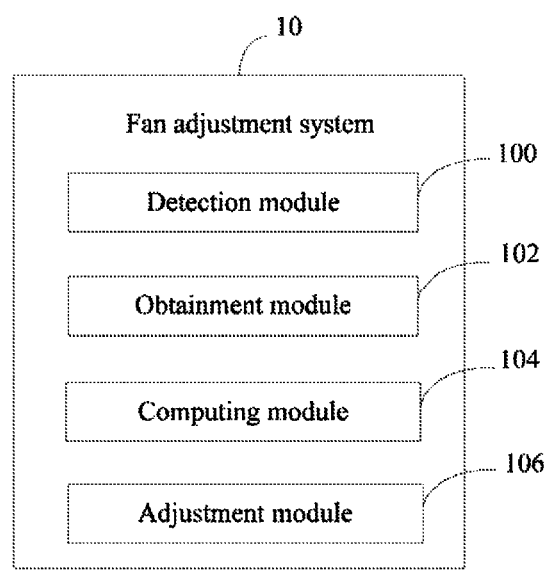
FIG. 2 is a block diagram of one embodiment of function modules of the fan adjustment system in FIG. 1.

FIG. 2 is a block diagram of one embodiment of function modules of the fan adjustment system 10 in FIG. 1. In the embodiment, the fan adjustment system 10 may include a detection module 100, an obtainment module 102, a computing module 104, and an adjustment module 106. The modules may comprise computerized codes in the form of one or more programs that are stored in the storage device 12 and executed by the at least one processor 14 to provide functions for implementing the fan adjustment system 10. The functions of the function modules are illustrated in FIG. 3 and described below.

Figure 3:
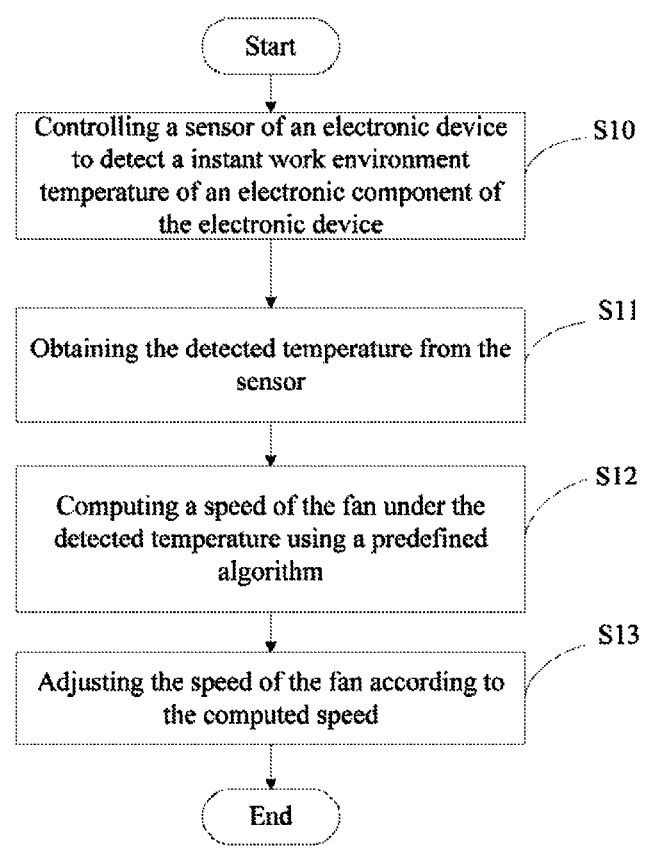
FIG. 3 is a flowchart of one embodiment of a method for adjusting fan of the electronic device.

FIG. 3 illustrates a flowchart of one embodiment of a method for adjusting fan of the electronic device 1. Depending on the embodiment, additional steps may be added, others removed, and the ordering of the steps may be changed.

In block S10, the detection module 100 detects the instant work environment temperature of the electronic component 18 by means of the sensor 16.

In block S11, the obtainment module 102 obtains the detected temperature from the sensor 16.

In block S12, the computing module 104 computes a speed of the fan 20 relative to the detected temperature using a predefined algorithm, wherein the computed speed of the fan 20 can achieve a heat dissipation mode and energy-saving mode of the electronic device 1. In the embodiment, the predefined algorithm may be: $y=a*x^2+b*x+c$, where "y" represents the speed of the fan 20, and "x" represents the work environment temperature of the electronic component 18 detected by the sensor 16. The method for computing values of "a", "b", and "c" are as described in FIG. 4.

In block S13, the adjustment module 106 adjusts the fan 20 of the electronic device 1 according to the computed speed. In the embodiment, the heat dissipation mode is defined as a mode for reducing the work environment temperature of the electronic component 18, and the energy-saving mode is defined as a mode for saving electric power of the electronic device 1.

Figure 4:
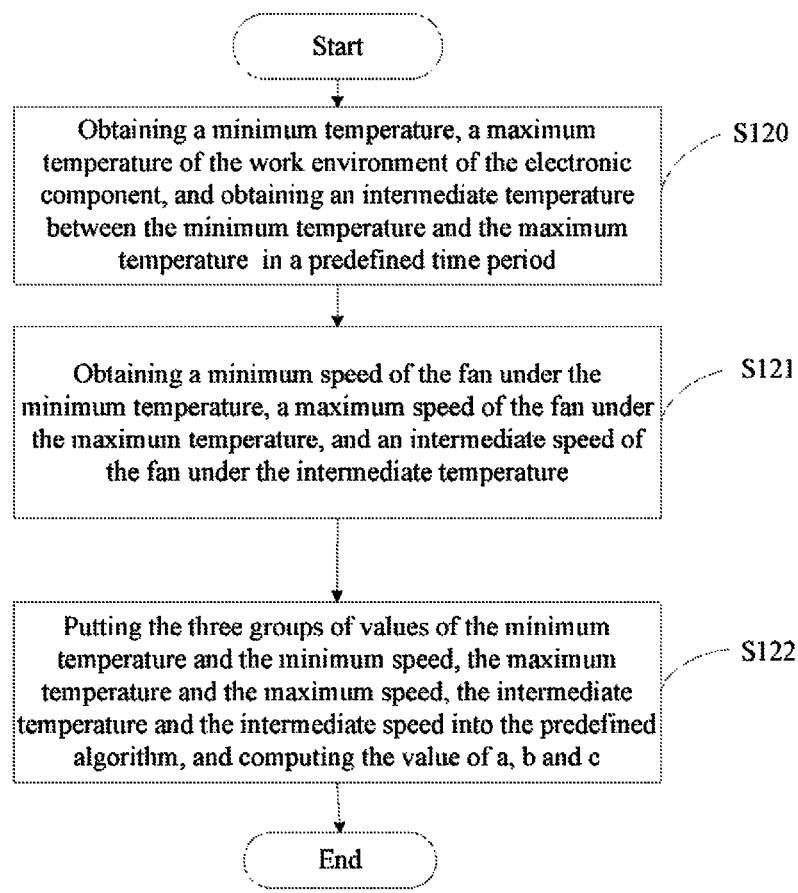
FIG. 4 is a flowchart of one embodiment of a method for computing values of "a", "b", and "c" in a predefined algorithm relative to the electronic device.

FIG. 4 illustrates a flowchart of one embodiment of a method for computing the values of "a", "b", and "c". Depending on the embodiment, additional steps may be added, others removed, and the ordering of the steps may be changed.

In block S120, the obtainment module 102 obtains a minimum temperature and a maximum temperature of the work environment of the electronic component 18, and obtains an intermediate temperature between the minimum temperature and the maximum temperature within a predefined time period. The predefined time period may be defined as one hour, for example.

In block S121, the obtainment module 102 obtains a minimum speed of the fan 20 under the minimum temperature, and a maximum speed of the fan 20 under the maximum temperature, and obtains an intermediate speed of the fan 20 under the intermediate temperature. In the embodiment, the minimum speed, the maximum speed, and the intermediate speed are chosen from more than one speed which can achieve the heat dissipation mode and the energy-saving mode under the minimum temperature, the maximum temperature, and the intermediate temperature. The minimum speed, the maximum speed, and the intermediate speed of the fan 20 are values produced by experience, obtained through testing experiments, and are stored in the storage device 12 in advance.

In block S122, the computing module 106 puts the three groups of values of the minimum temperature and the minimum speed, the maximum temperature and the maximum speed, the intermediate temperature and the intermediate speed into the predefined algorithm, and computes the values of "a", "b" and "c".

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. An electronic device, comprising:
   at least one processor; and
   a storage device storing a computer program including instructions that, which executed by the at least one processor, causes the at least one processor to:
   control a sensor of the electronic device to detect a instant work environment temperature of an electronic component of the electronic device;
   obtain the detected temperature from the sensor;
   compute a speed of the fan under the detected temperature using a predefined algorithm "y=a*x^2+b*x+c", wherein "y" represents the speed of the fan, "x" represents the instant work environment temperature of the electronic component detected by the sensor, and "a", "b", and "c" are computed by putting three groups of experience values of the speed "y" and the work environment temperature "x" into the predefined algorithm;
   adjust the speed of the fan according to the computed speed.

2. The electronic device according to claim 1, wherein the three experience values of the speed "y" are one minimum speed, one maximum speed, and one intermediate speed of the work environment of the electronic component in a predefined time period, and the three experience values of the work environment temperature "x" are one minimum temperature and one maximum temperature, and the intermediate temperature.

3. A method for adjusting a fan of an electronic device, the method comprising:
   controlling a sensor of the electronic device to detect a instant work environment temperature of an electronic component of the electronic device;
   obtaining the detected temperature from the sensor;
   computing a speed of the fan under the detected temperature using a predefined algorithm "y=a*x^2+b*x+c", wherein "y" represents the speed of the fan, "x" represents the instant work environment temperature of the electronic component detected by the sensor, and the values of "a", "b", and "c" are computed by putting three group of experience values of the speed "y" and the work environment temperature "x" into the predefined algorithm; and
   adjusting the speed of the fan according to the computed speed.

4. The method according to claim 3, wherein the three experience values of the speed "y" are one minimum speed, one maximum speed, and one intermediate speed of the work environment of the electronic component in a predefined time period, and the three experience values of the work environment temperature "x" are one minimum temperature and one maximum temperature, and the intermediate temperature.

5. A non-transitory computer-readable storage medium having stored thereon instructions being executed by a processor of an electronic device, causes the processor to perform a method for adjusting a fan of the electronic device, the method comprising:
   controlling a sensor of the electronic device to detect a instant work environment temperature of an electronic component of the electronic device;
   obtaining the detected temperature from the sensor;
   computing a speed of the fan under the detected temperature using a predefined algorithm "y=a*x^2+b*x+c", wherein "y" represents the speed of the fan, "x" represents the instant work environment temperature of the electronic component detected by the sensor, and the values of "a", "b", and "c" are computed by putting three groups of experience values of the speed "y" and the work environment temperature "x" into the predefined algorithm; and
   adjusting the speed of the fan according to the computed speed.

6. The storage medium according to claim 5, wherein the three experience values of the speed "y" are one minimum speed, one maximum speed, and one intermediate speed of the work environment of the electronic component in a predefined time period, and the three experience values of the work environment temperature "x" are one minimum temperature and one maximum temperature, and the intermediate temperature.

* * * * *